United States Patent
An (10) Patent No.: US 10,277,008 B1
(45) Date of Patent: Apr. 30, 2019

(54) TUNABLE LASER DEVICE AND METHOD FOR MANUFACTURING THE SAME

(71) Applicant: Electronics and Telecommunications Research Institute, Daejeon (KR)

(72) Inventor: Shinmo An, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/956,187

(22) Filed: Apr. 18, 2018

(30) Foreign Application Priority Data

Dec. 15, 2017 (KR) .................. 10-2017-0173631

(51) Int. Cl.
*H01S 5/00* (2006.01)
*H01S 5/062* (2006.01)
(Continued)

(52) U.S. Cl.
CPC .......... *H01S 5/06246* (2013.01); *H01S 5/062* (2013.01); *H01S 5/0625* (2013.01);
(Continued)

(58) Field of Classification Search
CPC ...... H01S 5/34; H01S 5/06256; H01S 5/0625; H01S 5/125; H01S 5/06246; H01S 5/06206; H01S 5/062; H01S 5/124
See application file for complete search history.

(56) References Cited

U.S. PATENT DOCUMENTS 5,155,736 A 10/1992 Ono et al.
5,231,642 A * 7/1993 Scifres .................. H01S 5/1032
372/102
(Continued)

FOREIGN PATENT DOCUMENTS

KR 10-0766027 B1 10/2007
KR 10-2015-0097306 A 8/2015
KR 10-2017-0003560 A 1/2017

OTHER PUBLICATIONS

Marianna Pantouvaki et al., "Fast tuneable InGaAsP DBR laser using quantum confined Stark effect induced refractive index change", IEEE Journal of Selected Topics in Quantum Electronics, vol. 13, No. 5, pp. 1-10, Sep./Oct. 2007.
(Continued)

*Primary Examiner* — Kinam Park
(74) *Attorney, Agent, or Firm* — Rabin & Berdo, P.C.

(57) ABSTRACT

Provided is a tunable laser device. The tunable laser device includes a lower clad layer, first to third quantum well patterns disposed on the lower clad layer and arranged in a first direction parallel to a top surface of the lower clad layer, an upper clad layer disposed on the first quantum well pattern, and first grating patterns disposed between the third quantum well pattern and the lower clad layer. The first to third quantum well patterns are arranged in the first direction parallel to a top surface of the lower clad layer, the upper clad layer includes a p-type conductive clad layer, the upper clad layer includes an n-type conductive clad layer, and the third quantum well pattern is electrically intrinsic. When a reverse bias is applied to the upper clad layer, the third quantum well pattern, and the lower clad layer, the third quantum well pattern is changed in refractive index.

15 Claims, 9 Drawing Sheets

(51) Int. Cl.
*H01S 5/34* (2006.01)
*H01S 5/0625* (2006.01)
*H01S 5/125* (2006.01)
*H01S 5/12* (2006.01)

(52) U.S. Cl.
CPC ...... *H01S 5/06206* (2013.01); *H01S 5/06256* (2013.01); *H01S 5/124* (2013.01); *H01S 5/125* (2013.01); *H01S 5/34* (2013.01)

(56) References Cited

U.S. PATENT DOCUMENTS

| | | | |
|---|---|---|---|
| 5,764,670 A * | 6/1998 | Ouchi | B82Y 20/00 372/45.01 |
| 6,028,876 A | 2/2000 | Lee et al. | |
| 6,406,932 B2 | 6/2002 | Lee et al. | |
| 7,580,595 B1 * | 8/2009 | Bimberg | B82Y 20/00 385/132 |
| 8,805,134 B1 * | 8/2014 | Raring | H01S 5/026 385/14 |
| 8,917,752 B2 | 12/2014 | Chung | |
| 2003/0081642 A1 * | 5/2003 | Hwang | H01S 5/18341 372/45.01 |
| 2003/0108081 A1 | 6/2003 | Ryu et al. | |
| 2003/0134448 A1 | 7/2003 | Ju et al. | |
| 2005/0123300 A1 | 6/2005 | Kim et al. | |
| 2010/0290495 A1 * | 11/2010 | Donegan | H01S 5/0265 372/46.012 |
| 2017/0033534 A1 | 2/2017 | Chung et al. | |
| 2018/0090576 A1 * | 3/2018 | Kim | |

OTHER PUBLICATIONS

Ju-Bin Song, "Quaternary InGaAsP MQW QCSE Tuned Multichannel Source for DWDM Networks", Journal of the Institute of electronics and Information Engineers SD (Semiconductor & Device), vol. 41, No. 4, pp. 49-56, Apr. 2004.

* cited by examiner

TUNABLE LASER DEVICE AND METHOD FOR MANUFACTURING THE SAME

CROSS-REFERENCE TO RELATED APPLICATIONS

This U.S. non-provisional patent application claims priority under 35 U.S.C. § 119 of Korean Patent Application No. 10-2017-0173631, filed on Dec. 15, 2017, the entire contents of which are hereby incorporated by reference.

BACKGROUND

The present disclosure herein relates to a tunable laser device and a method for manufacturing the same.

With the development of optical communication technology, the demand for laser devices having wavelength tunability is increasing. A typical tunable laser device includes an active layer that converts electrical energy into light energy to emit light, a plurality of reflector layers that reflects the generated light under predetermined resonance conditions, a cavity layer between the reflector layers, and a phase layer that adjusts a refractive index of a portion of the cavity layer to adjust a phase of the proceeding light and thereby to finely control an oscillation wavelength. Tunable laser devices are divided into a single integrated type in which the layers are disposed on one chip and an external cavity type in which the layers are disposed on two or more chips.

A typical oscillation wavelength is controlled by mounting a heater on the reflector layer or the phase layer to varying a wavelength by using a refractive index change due to a thermal effect. The wavelength tuning using the thermo-optic effect has an advantage of obtaining a stable wavelength change and wide wavelength tuning capability according to current applied to the heater. However, the wavelength tuning method using the thermo-optic effect has disadvantages in which power consumption is high, and a wavelength tuning rate is low.

SUMMARY

The present disclosure provides a tunable laser device having low power characteristics and high speed tuning characteristics.

The present disclosure also provides a method for manufacturing a tunable laser device having low power characteristics and high speed tuning characteristics.

However, objects of the inventive concept are not limited to the abovementioned objects.

An embodiment of the inventive concept provides a tunable laser device includes: a lower clad layer; first to third quantum well patterns disposed on the lower clad layer and arranged in a first direction parallel to a top surface of the lower clad layer; an upper clad layer disposed on the first quantum well pattern; and first grating patterns disposed between the third quantum well pattern and the lower clad layer, wherein the first to third quantum well patterns are arranged in the first direction parallel to a top surface of the lower clad layer, the upper clad layer includes a p-type conductive clad layer, the upper clad layer includes an n-type conductive clad layer, the third quantum well pattern is electrically intrinsic, and when a reverse bias is applied to the upper clad layer, the third quantum well pattern, and the lower clad layer, the third quantum well pattern is changed in refractive index.

In an embodiment, the tunable laser device may further include: a first passive optical waveguide pattern disposed between the first and second quantum well patterns and optically coupled to the first and second quantum well patterns; and a second passive optical waveguide pattern disposed between the second and third quantum well patterns and optically coupled to the second and third quantum well patterns, wherein each of the first passive optical waveguide pattern and the second passive optical waveguide pattern may have a refractive index different from that of the lower clad layer.

In an embodiment, the tunable laser device may further include an airgap provided between the first grating patterns and the lower clad layer, wherein the first grating patterns may be exposed by the airgap.

In an embodiment, the tunable laser device may further include an insulation layer disposed between the first quantum well pattern and the lower clad layer, wherein the first grating patterns may be disposed within the insulation layer.

In an embodiment, the tunable laser device may further include a reflection layer disposed on a side surface of the third quantum well pattern to extend along the side surface of the third quantum well pattern.

In an embodiment, the tunable laser device may further include: a fourth quantum well pattern spaced apart from the third quantum well pattern in the first direction; a third passive optical waveguide pattern disposed between the third and fourth quantum well patterns and optically coupled to the third and fourth quantum well patterns; and second grating patterns disposed between the fourth quantum well pattern and the lower clad layer, wherein the fourth quantum well pattern may be electrically intrinsic, and when the reverse bias is applied to the upper clad layer, the fourth quantum well pattern, and the lower clad layer, the fourth quantum well pattern may be changed in refractive index.

In an embodiment, each of the first and second grating patterns may include a distributed bragg reflector (DBR) or a sampled-grating DBR.

In an embodiment, the tunable laser device may further include a spacer disposed between the first to third quantum well patterns and the first grating patterns, wherein the spacer may include substantially the same material as the lower clad layer.

In an embodiment, the tunable laser device may further include: a fifth quantum well pattern disposed at an opposite side of the second quantum well pattern with the third quantum well pattern between the second and fifth quantum well patterns; and a sixth quantum well pattern disposed at an opposite side of the third quantum well pattern with the fifth quantum well pattern between the third and sixth quantum well patterns, wherein the fifth and sixth quantum well patterns may be disposed on the lower clad layer.

In an embodiment, the tunable laser device may further include a passive optical waveguide layer disposed between the first to third quantum well patterns and the first grating patterns to extend in the first direction.

In an embodiment of the inventive concept, a method for manufacturing a tunable laser device includes: preparing a lower clad layer; forming a first quantum well pattern, a second quantum well pattern, and a third quantum well pattern on the lower clad layer; forming a first passive optical waveguide pattern between the first and second quantum well patterns and a second passive optical waveguide pattern between the second and third quantum well patterns; and forming an upper clad layer on the first to third quantum well patterns, wherein the first quantum well pattern, the first passive optical waveguide pattern, the second quantum well pattern, the second passive optical waveguide pattern, and the third quantum well pattern are arranged in a first direction parallel to a top surface of the lower clad layer.

In an embodiment, the method may further include: forming grating patterns on the lower clad layer before the forming of the first to third quantum well patterns; and forming a spacer layer on the lower clad layer to cover the grating patterns, wherein the spacer layer may extend in the first direction.

In an embodiment, the forming of the first quantum well pattern may include: forming a first preliminary quantum well layer, which extends in the first direction, on the spacer layer; and patterning the first preliminary quantum well layer.

In an embodiment, the forming of the second and third quantum well patterns may include: forming a second preliminary quantum well layer, which extends in the first direction, on the spacer layer; and patterning the second preliminary quantum well layer.

In an embodiment, the forming of the first passive optical waveguide pattern and the second passive optical waveguide pattern may include: forming a preliminary optical waveguide layer on the first to third quantum well patterns and the spacer layer; and removing the preliminary optical waveguide layer formed on the first to third quantum well patterns to expose top surfaces of the third to third quantum well patterns.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Exemplary embodiments of technical ideas of the inventive concept will be described with reference to the accompanying drawings so as to sufficiently understand constitutions and effects of the inventive concept. The technical ideas of the inventive concept may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

Like reference numerals refer to like elements throughout. The embodiments in the detailed description will be described with perspective views, front views, cross-sectional views, and/or conceptual views as ideal exemplary views of the inventive concept. In the figures, the dimensions of regions are exaggerated for effective description of the technical contents. Areas exemplified in the drawings have general properties and are used to illustrate a specific shape of a device. Thus, this should not be construed as limited to the scope of the inventive concept. Also, although various terms are used to describe various components in various embodiments of the inventive concept, the component are not limited to these terms. These terms are only used to distinguish one component from another component. Embodiments described and exemplified herein include complementary embodiments thereof.

In the following description, the technical terms are used only for explaining a specific exemplary embodiment while not limiting the inventive concept. In this specification, the terms of a singular form may include plural forms unless specifically mentioned. The meaning of 'comprises' and/or 'comprising' does not exclude other components besides a mentioned component.

Hereinafter, the present disclosure will be described in detail by explaining preferred embodiments of the technical ideas of the inventive concept with reference to the attached drawings.

Figure 1:
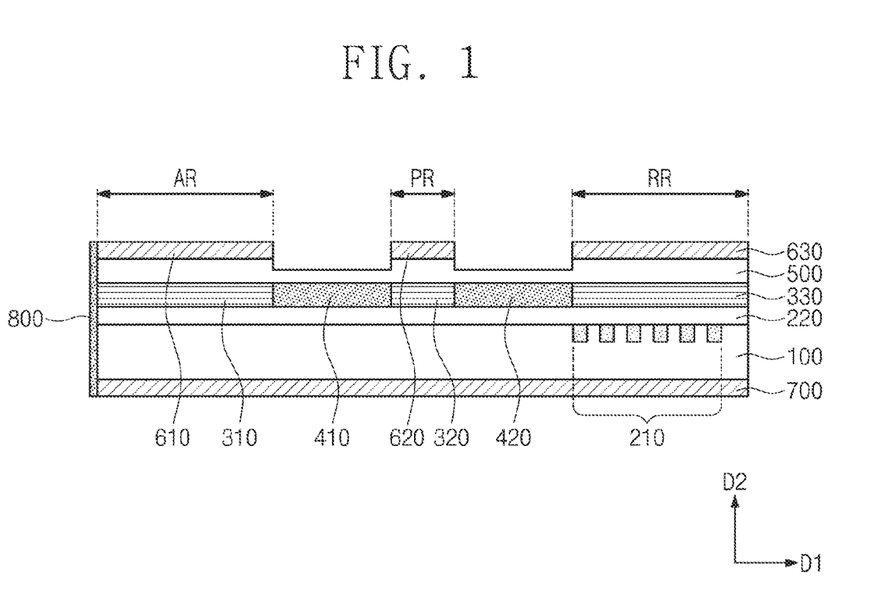
FIG. 1 is a cross-sectional view of a tunable laser device according to exemplary embodiments of the inventive concept.

FIG. 1 is a cross-sectional view of a tunable laser device according to exemplary embodiments of the inventive concept.

Referring to FIG. 1, a tunable laser device 10 including an active region AR, a phase adjustment region PR, and a reflection region RR may be provided. In the active region AR, light may be generated by a voltage applied from the outside. The light may proceed to the phase adjustment region PR and the reflection region RR. In the phase adjustment region PR, the light may be shifted in phase. A wavelength of a laser oscillated from the tunable laser device 10 may be finely adjusted by the phase shift. In the reflection region RR, the light may be reflected. In the reflection region RR, light having a desired wavelength may be selectively reflected. The light having the required wavelength may be synthetic light of light having the wavelength and wavelengths adjacent to the wavelength. The light having the required wavelength may be repeatedly reflected by the reflection region RR and a reflection layer 800 and thus have a coherent state. The light having the coherent state may be oscillated out of the tunable laser device 10 to provide the laser.

The tunable laser device 10 may include a lower clad layer 100, grating patterns 210, a spacer layer 220, a first quantum well pattern 310, a second quantum well pattern 320, a third quantum well pattern 330, a first passive optical waveguide pattern 410, a second passive optical waveguide pattern 420, an upper clad layer 500, a first upper electrode 610, a second upper electrode 620, a third upper electrode 630, a lower electrode 700, and a reflection layer 800.

The lower clad layer 100 may cross the active region AR, the phase adjustment area PR, and the reflection region RR. In exemplary embodiments, the lower clad layer 100 may include one selected from InP, GaAs, AlAs, InAs, AlGaAs, AlInAs, InGaAs, GaN, and InGaN. The lower clad layer 100 may be an n-type conductive clad layer.

The grating patterns 210 may be provided within the reflection region RR. The grating patterns 210 may be disposed in an upper portion of the lower clad layer 100. The grating patterns 210 may have top surface that is coplanar with a top surface of the lower clad layer 100. The grating patterns 210 may be arranged in a first direction D1 parallel to the top surface of the lower clad layer 100. The grating patterns 210 may wavelength-selectively reflect light. For example, each of the grating patterns 210 may be a distributed bragg reflector (DBR). The grating patterns 210 may have an arrangement period. The arrangement period may be a distance between centers of the grating patterns 210 that are adjacent to each other. A wavelength of light reflected by the grating patterns 210 may be determined by the period of the grating patterns 210. That is, when the wavelength of the light reflected by the grating patterns 210 is determined, the period of the grating patterns 210 may be determined. For example, the period of the grating patterns 210 may be about 100 nm to about 1,000 nm. The reflected light may be synthetic light of light having the wavelength and wavelengths adjacent to the wavelength.

The grating patterns 210 may have a uniform width and a uniform thickness. Each of the grating patterns 210 may be controlled in width and thickness to adjust power and noise of a laser (not shown) generated from the tunable laser device 10. For example, each of the grating patterns 210 may have a width of about 10 nm to about 500 nm and a thickness of about 10 Å to about 5,000 Å. Each of the grating patterns 210 may have a refractive index different from that of the lower clad layer 100. For example, each of the grating patterns 210 may include one selected from InP, GaAs, AlAs, InAs, AlGaAs, AlInAs, InGaAs, InGaAs, InAlAs, InGaAsP, InAlGaAs, GaN, and InGaN.

The spacer layer 220 may be disposed on the lower clad layer 100. The spacer layer 220 may extend in the first direction D1 to cross the active region AR, the phase adjustment region PR, and the reflection region RR. The spacer layer 220 may cover the grating patterns 210. Thus, the grating patterns 210 may be disposed between the lower clad layer 100 and the spacer layer 220. The spacer layer 220 may have a thickness in proportional to a length of the tunable laser device 10 in the first direction D1. For example, the spacer layer 220 may have a thickness of about 1,000 nm or less. The spacer layer 220 may include substantially the same material as the lower clad layer 100. For example, the spacer layer 220 may include one selected from InP, GaAs, AlAs, InAs, AlGaAs, AlInAs, InGaAs, GaN, and InGaN. The spacer layer 220 may be an n-type conductive spacer layer.

The first to third quantum well patterns 310, 320, and 330 may be disposed on the spacer layer 220. The first to third quantum well patterns 310, 320, and 330 may be arranged in the first direction D1 and then respectively provided in the active region AR, the phase adjustment region PR, and the reflection region RR. The first to third quantum well patterns 310, 320, and 330 may be spaced apart from each other in the first direction D1. Each of the first to third quantum well patterns 310, 320, and 330 may have a multilayer structure to form a quantum well. For example, each of the first to third quantum well patterns 310, 320, and 330 may have a structure in which two layers including materials different from each other are alternately repeatedly laminated. For example, the materials different from each other may be selected from InP, GaAs, AlAs, InAs, AlGaAs, AlInAs, InGaAs, InGaAs, InAlAs, InGaAsP, InAlGaAs, GaN, and InGaN. In exemplary embodiments, the second and third quantum well patterns 320 and 330 may have substantially the same material and structure, and the first quantum well pattern 310 may have a material and structure, which are different from those of the second and third quantum well patterns 320 and 330. The first to third quantum well patterns 310, 320, and 330 may have substantially the same thickness. For example, each of the first to third quantum well patterns 310, 320, and 330 may have the total thickness of about 10 nm to about 2,000 nm. Each of the first to third quantum well patterns 310, 320, and 330 may include a multi quantum well (MQW). Each of the first to third quantum well patterns 310, 320, and 330 may be intrinsic.

When a forward bias is applied to the active region AR, light may be generated from the first quantum well pattern 310. When a reverse bias is applied to the phase adjustment region PR and/or the reflection region RR, a quantum confined stark effect (QCSE) may occur in the second and third quantum well patterns 320 and 330. The second and third quantum well patterns 320 and 330 may have refractive indexes that vary by the QCSE. The refractive index of each of the second and third quantum well patterns 320 and 330 may be controlled to adjust a wavelength of the laser that is oscillated from the tunable laser device 10.

The first and second passive optical waveguide patterns 410 and 420 may be disposed on the spacer layer 220. The first passive optical waveguide pattern 410 may be disposed between the first and second quantum well patterns 310 and 320. The first passive optical waveguide pattern 410 may optically connect the first and second quantum well patterns 310 and 320 to each other. For example, the first passive optical waveguide pattern 410 may come into direct contact with the first and second quantum well patterns 310 and 320. The second passive optical waveguide pattern 420 may be disposed between the second and third quantum well patterns 320 and 330. The second passive optical waveguide pattern 420 may optically connect the second and third quantum well patterns 320 and 330 to each other. For example, the second passive optical waveguide pattern 420 may come into direct contact with the second and third quantum well patterns 320 and 330.

The first and second passive optical waveguide patterns 410 and 420 may have a uniform thickness. Each of the first and second passive optical waveguide patterns 410 and 420 may have the same thickness as each of the first to third quantum well patterns 310, 320, and 330. For example, each of the first and second passive optical waveguide patterns 410 and 420 may have a thickness of about 10 nm to about 2,000 nm. In exemplary embodiments, each of the first and second passive optical waveguide patterns 410 and 420 may include one selected from InP, GaAs, AlAs, InAs, AlGaAs, AlInAs, InGaAs, InGaAs, InAlAs, InGaAsP, InAlGaAs, GaN, and InGaN. Each of the first and second passive optical waveguide patterns 410 and 420 may be electrically intrinsic.

The upper clad layer 500 may be disposed on the first to third quantum well patterns 310, 320, and 330 and the first and second passive optical waveguide patterns 410 and 420. The upper clad layer 500 may extend in the first direction DR1 to cross the active region AR, the phase adjustment region PR, and the reflection region RR. The upper clad layer 500 may have a uniform thickness within the active region AR, the phase adjustment area PR, and the reflection region RR. For example, the upper clad layer 500 may have a thickness of about 10 nm to about 5,000 nm within the active region AR, the phase adjustment area PR, and the reflection region RR. The thickness of the upper clad layer 500 on the first and second passive optical waveguide patterns 410 and 420 may be less than that of the upper clad layer 500 within the active region AR, the phase adjustment region PR, and the reflection region RR. The upper clad layer 500 may have substantially the same refractive index as the lower clad layer 100. For example, the upper clad layer 500 may include one selected from InP, GaAs, AlAs, InAs, AlGaAs, AlInAs, InGaAs, GaN, and InGaN. The upper clad layer 500 may be a p-type conductive clad layer.

The first to third upper electrodes 610, 620, and 630 may be disposed within the active region AR, the phase adjustment region PR, and the reflection region RR, respectively. The first to third upper electrodes 610, 620, and 630 may be disposed on the upper clad layer 500. Each of the first to third upper electrodes 610, 620, and 630 may include a conductive material. For example, each of the first to third upper electrodes 610, 620, and 630 may include gold (Au), copper (Cu), or aluminum (Al).

The lower electrode 700 may be disposed on a bottom surface of the lower clad layer 100. The lower electrode 700 may extend in the first direction DR1 to cross the active region AR, the phase adjustment region PR, and the reflection region RR. The lower electrode 700 may include a conductive material. For example, the lower electrode 700 may include gold (Au), copper (Cu), or aluminum (Al).

The reflection layer 800 may be disposed on side surfaces of the lower clad layer 100, the spacer layer 220, the first quantum well pattern 310, the upper clad layer 500, the first upper electrode 610, and the lower electrode 700. The reflection layer 800 may reflect light. For example, the reflection layer 800 may include high-reflective (HR) coating.

In general, the tunable laser device may generate heat at a core to adjust a wavelength of a laser. A method for tuning the laser using heat may have high power consumption characteristics and low tuning rate characteristics.

The tunable laser device 10 according to the inventive concept may adjust a wavelength of the laser through the method in which the QCSE is generated by using a voltage. The method for tuning the laser using the voltage may have low power consumption characteristics and high tuning rate characteristics. As a result, the tunable laser device 10 may be improved in power characteristic and tuning rate characteristic.

Figure 2:
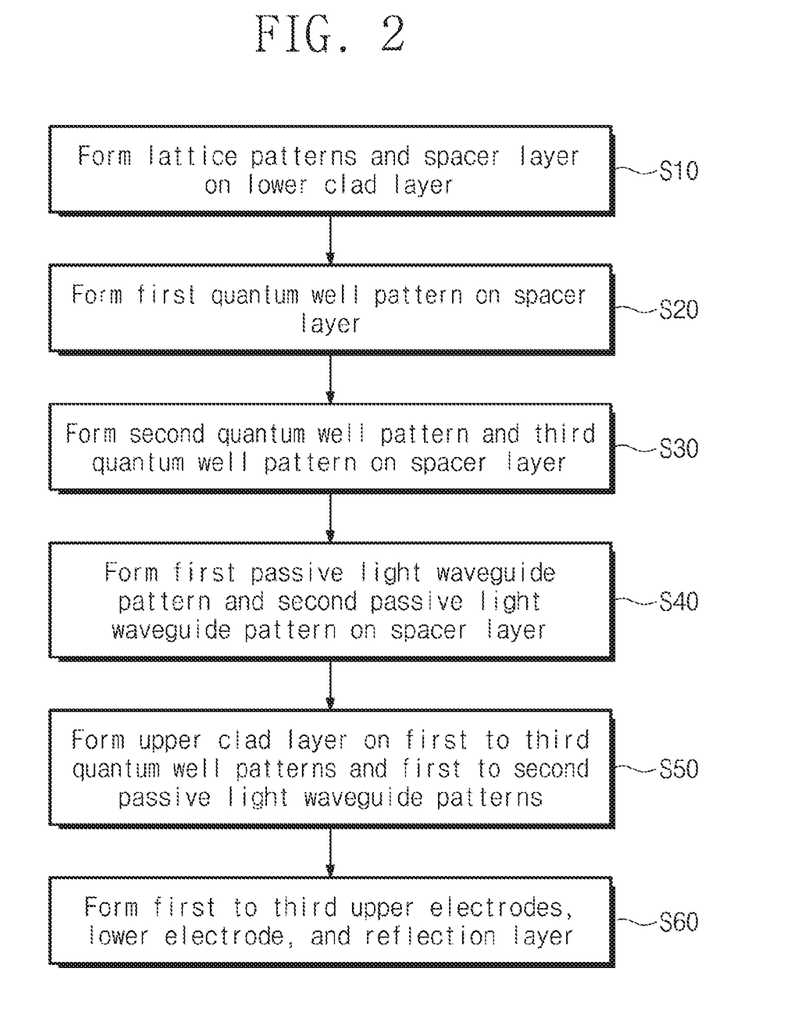
FIG. 2 is a flowchart for explaining a method for manufacturing the tunable laser device according to exemplary embodiments of the inventive concept.

FIG. 2 is a flowchart for explaining a method for manufacturing the tunable laser device according to exemplary embodiments of the inventive concept. FIGS. 3 to 7 are cross-sectional views for explaining the method for manufacturing the tunable laser device according to exemplary embodiments of the inventive concept.

Figure 3:
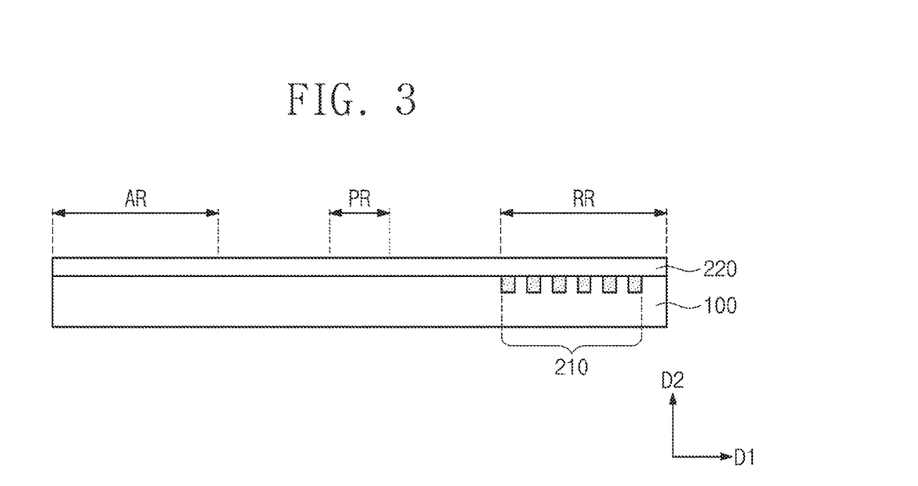
FIGS. 3 to 7 are cross-sectional views for explaining the method for manufacturing the tunable laser device according to exemplary embodiments of the inventive concept.

Referring to FIGS. 2 and 3, grating patterns 210 and a spacer layer 220 may be formed on a lower clad layer 100 (S10). The lower clad layer 100 may include a semiconductor material. For example, the lower clad layer 100 may include one selected from InP, GaAs, AlAs, InAs, AlGaAs, AlInAs, InGaAs, GaN, and InGaN. The lower clad layer 100 may be an n-type conductive clad layer.

The process of forming the grating patterns 210 may include a process of forming a preliminary grating layer (not shown) on the lower clad layer 100 and a process of patterning the preliminary grating layer. The preliminary grating layer has a refractive index greater than that of the lower clad layer 100. The process of forming the preliminary grating layer may include a process of depositing one selected from InP, GaAs, AlAs, InAs, AlGaAs, AlInAs, InGaAs, InGaAs, InAlAs, InGaAsP, InAlGaAs, GaN, and InGaN. The deposition process may include a chemical vapor deposition (CVD) process, a physical vapor deposition (PVD) process, an atomic layer deposition (ALD) process, a metal organic chemical vapor deposition (MOCVD) process, a metal organic vapor epitaxy (MOVPE) process, or a molecular beam epitaxy (MBE) process. In exemplary embodiments, the preliminary grating layer may have a thickness of about 10 Å to about 5,000 Å. The grating patterns 210 may have a period of about 100 nm to about 1,000 nm, and each of the grating patterns 210 may have a width of about 10 nm to about 500 nm.

Substantially the same material as the lower clad layer 100 may be deposited on the lower clad layer 100 to cover the grating pattern 210. For example, one selected from InP, GaAs, AlAs, InAs, AlGaAs, AlInAs, InGaAs, GaN, and InGaN may be deposited on the lower clad layer 100. The deposition process may include a chemical vapor deposition (CVD) process, a physical vapor deposition (PVD) process, an atomic layer deposition (ALD) process, a metal organic chemical vapor deposition (MOCVD) process, a metal organic vapor epitaxy (MOVPE) process, or a molecular beam epitaxy (MBE) process. A layer including one selected from InP, GaAs, AlAs, InAs, AlGaAs, AlInAs, InGaAs, GaN, and InGaN, which is disposed at a height greater than that of a top surface of each of the grating patterns 210, may be called a spacer layer 220. For example, the spacer layer 220 may be deposited to have a thickness of about 5,000 Å or more. Thus, the spacer layer 220 may cover the grating patterns 210.

Figure 4:
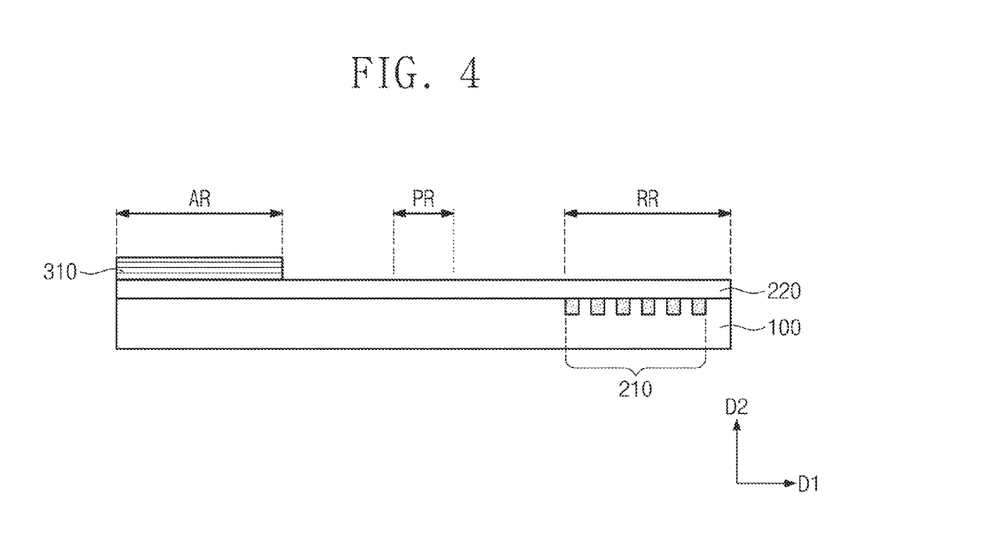

Referring to FIGS. 2 and 4, a first quantum well pattern 310 may be formed on the spacer layer 220 (S20). The process of forming the first quantum well pattern 310 may include a process of forming a first quantum well layer (not shown) on the spacer layer 220, a process of forming a first photoresist pattern (not shown) on the first quantum well layer, and a process of performing an etching process using the first photoresist pattern as an etch mask to pattern the first quantum well layer. The process of forming the first quantum well layer may include a process of alternately depositing at lest two materials selected from InP, GaAs, AlAs, InAs, AlGaAs, AlInAs, InGaAs, InGaAs, InAlAs, InGaAsP, InAlGaAs, GaN, and InGaN. Thus, the first quantum well layer may have a multilayer structure. The deposition process may include a chemical vapor deposition (CVD) process, a physical vapor deposition (PVD) process, an atomic layer deposition (ALD) process, a metal organic chemical vapor deposition (MOCVD) process, a metal organic vapor epitaxy (MOVPE) process, or a molecular beam epitaxy (MBE) process. The first quantum well layer may be formed to have a thickness of about 10 nm to about 2,000 nm. The first quantum well layer may be electrically intrinsic. The first quantum well pattern 310 may be formed within an active region AR.

Figure 5:
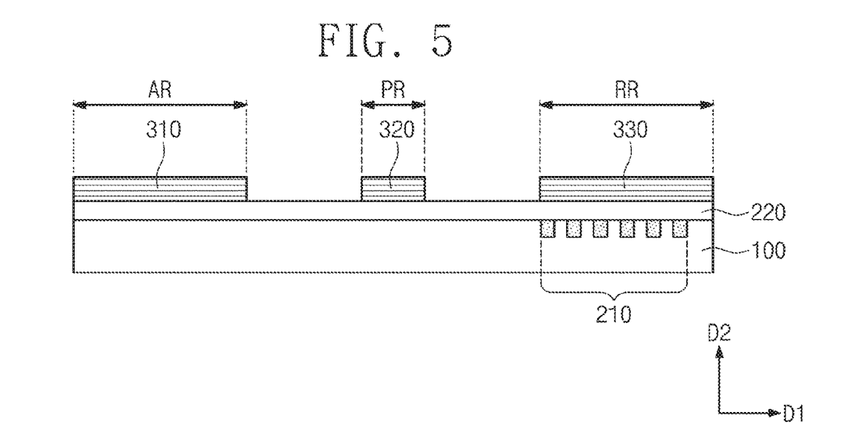

Referring to FIGS. 2 and 5, second and third quantum well patterns 320 and 330 may be formed on the spacer layer 220 (S30). The process of forming the second and third quantum well patterns 320 and 330 may include a process of forming a second quantum well layer (not shown) on the spacer layer 220, a process of forming a second photoresist pattern (not shown) on the second quantum well layer, and a process of performing an etching process using the second photoresist pattern as an etch mask to pattern the second quantum well layer. The process of forming the second quantum well layer may include a process of alternately depositing at lest two materials selected from InP, GaAs, AlAs, InAs, AlGaAs, AlInAs, InGaAs, InGaAs, InAlAs, InGaAsP, InAlGaAs, GaN, and InGaN. Thus, the second quantum well layer may have a multilayer structure. The deposition process may include a chemical vapor deposition (CVD) process, a physical vapor deposition (PVD) process, an atomic layer deposition (ALD) process, a metal organic chemical vapor deposition (MOCVD) process, a metal organic vapor epitaxy (MOVPE) process, or a molecular beam epitaxy (MBE) process. The second quantum well layer may be formed to have a thickness of about 10 nm to about 2,000 nm. The second quantum well layer may be electrically intrinsic. Each of the second and third quantum well patterns 320 and 330 may be formed within a phase adjustment region PR and a reflection region RR.

Figure 6:
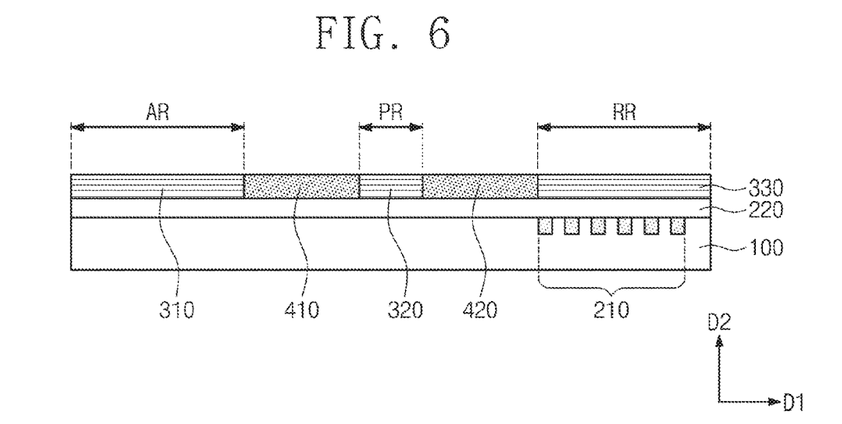

Referring to FIGS. 2 and 6, a first passive optical waveguide pattern 410 and a second passive optical waveguide pattern 420 may be formed on the spacer layer 220 that is exposed by the first to third quantum well patterns 310, 320, and 330 (S40). The process of forming the first and second passive optical waveguide patterns 410 and 420 may include a process of forming a passive optical waveguide layer (not shown) on the first to third quantum well patterns 310, 320, and 330 and the spacer layer 220 and a process of performing a planarization process on the passive optical waveguide layer to expose top surfaces of the first to third quantum well patterns 310, 320, and 330. The formation of the passive optical waveguide layer may include depositing one selected from InP, GaAs, AlAs, InAs, AlGaAs, AlInAs, InGaAs, InGaAs, InAlAs, InGaAsP, InAlGaAs, GaN, and InGaN. The deposition process may include a chemical vapor deposition (CVD) process, a physical vapor deposition (PVD) process, an atomic layer deposition (ALD) process, a metal organic chemical vapor deposition (MOCVD) process, a metal organic vapor epitaxy (MOVPE) process, or a molecular beam epitaxy (MBE) process. Each of the first and second passive optical waveguide patterns 410 and 420 may be formed to have a thickness of about 10 nm to about 2,000 nm. The top surfaces of the first and second passive optical waveguide patterns 410 and 420 may be coplanar with the top surfaces of the first to third quantum well patterns 310, 320, and 330.

In general, the quantum wells of the tunable laser device may have an intermixing structure. The process of forming the quantum wells having the intermixing structure may include an annealing process. The properties of the quantum wells may vary during the annealing process. Thus, the tunable laser device may be deteriorated in reliability.

The first to third quantum well patterns 310, 320, and 330 according to the inventive concept may be optically connected to each other by the first and second passive optical waveguide patterns 410 and 420. Such a coupling method may be called a butt-joint method. In the processes of forming the first to third quantum well patterns 310, 320, and 330 and the first and second passive optical waveguide patterns 410 and 420, the annealing process may not be required. Thus, the first to third quantum well patterns 310, 320, and 330 may be maintained in required characteristic. Therefore, the tunable laser device may be improved in reliability.

Figure 7:
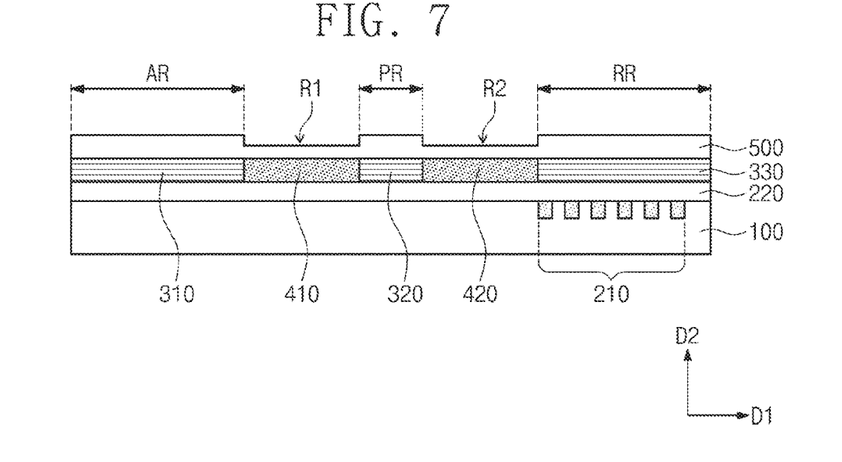

Referring to FIGS. 2 and 7, the upper clad layer 500 may be formed on the first to third quantum well patterns 310, 320, and 330 and the first and second passive optical waveguide patterns 410 and 420 (S50). The process of forming the upper clad layer 500 may include a process of depositing one selected from InP, GaAs, AlAs, InAs, AlGaAs, AlInAs, InGaAs, GaN, and InGaN and a process of forming a first recess region R1 and a second recess region R2 in an upper portion of the upper clad layer 500. The deposition process may include a chemical vapor deposition (CVD) process, a physical vapor deposition (PVD) process, or an atomic layer deposition (ALD) process. The upper clad layer 500 may be formed to have a thickness of about 10 nm to about 5,000 nm. The upper clad layer 500 may be a p-type conductive clad layer. The first and second recess regions R1 and R2 may respectively overlap the first and second passive optical waveguide patterns 410 and 420 in the second direction D2 perpendicular to a top surface of the lower clad layer 100.

Referring to FIGS. 1 and 2, a first upper electrode 610, a second upper electrode 620, and a third upper electrode 630 may be formed on the upper clad layer 500 (S60). The first to third upper electrodes 610, 620, and 630 may be disposed on the uppermost top surfaces of the upper clad layer 500, respectively. The uppermost surfaces of the upper clad layer 500 may be spaced apart from each other with the first and second recess regions R1 and R2 therebetween. A lower electrode 700 may be formed below the lower clad layer 100 (S60). The lower electrode 700 may cover a bottom surface of the lower clad layer 100. Each of the first to third upper electrodes 610, 620, and 630 and the lower electrode 700 may include a conductive material. For example, each of the first to third upper electrodes 610, 620, and 630 and the lower electrode 700 may include a metal, e.g., gold (Au), copper (Cu), or aluminum (Al). Side surfaces of the lower clad layer 100, the spacer layer 220, the first quantum well pattern 310, the upper clad layer 500, the first upper electrode 610, and the lower electrode 700 may be coplanar with each other. A reflection layer 800 may be formed on the side surfaces to provide the tunable laser device 10 (S60).

In the method for manufacturing the tunable laser device 10 according to the inventive concept, an annealing process may not be required. Thus, the tunable laser device 10 may be improved in reliability with respect to characteristics.

Figure 8:
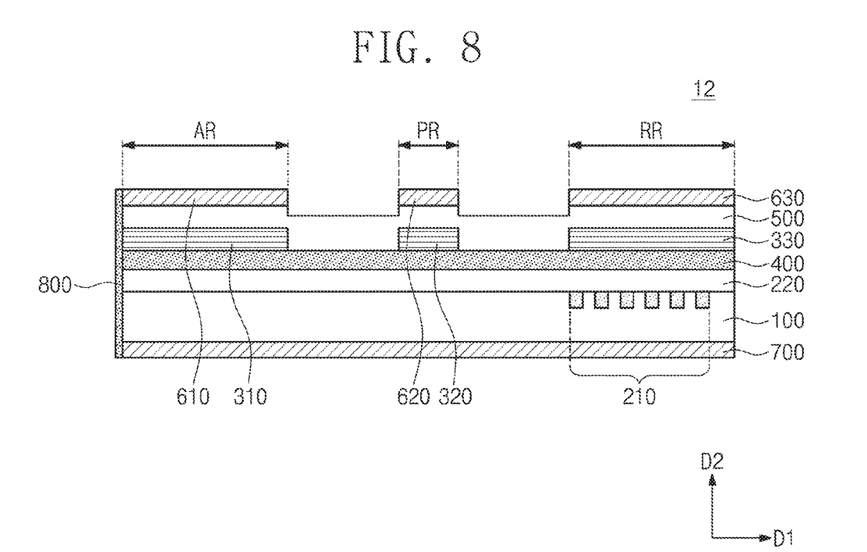
FIG. 8 is a cross-sectional view of a tunable laser device according to exemplary embodiments of the inventive concept.

FIG. 8 is a cross-sectional view of a tunable laser device according to exemplary embodiments of the inventive concept. For briefness of descriptions, substantially the same description as those described with reference to FIG. 1 will be omitted.

Referring to FIG. 8, a tunable laser device 12 including a lower clad layer 100, grating patterns 210, a spacer layer 220, first to third quantum well patterns 330, a passive optical waveguide pattern 400, upper clad layers 500, a first upper electrode 610, a second upper electrode 620, a third upper electrode 630, a lower electrode 700, and a reflection layer 800 may be provided. The tunable laser device 12 may include an active region AR, a phase adjustment area PR, and a reflection region RR.

Unlike the structure of FIG. 1, the passive optical waveguide layer 400 may be disposed on the spacer layer 220. The passive optical waveguide layer 400 may extend in the first direction DR1 to cross the active region AR, the phase adjustment region PR, and the reflection region RR.

The first to third quantum well patterns 310, 320, and 330 may be disposed on the passive optical waveguide layer 400. The first to third quantum well patterns 310, 320, and 330 may be optically coupled to the passive optical waveguide layer 400.

The upper clad layers 500 may be disposed on the first to third quantum well patterns 310, 320, and 330 and the passive optical waveguide layer 400. The upper clad layers 500 may cover top surfaces of the first to third quantum well patterns 310, 320, and 330 and top surfaces of the spacer layer 220, which are exposed between the first to third quantum well patterns 310, 320, and 330. Although the upper clad layers 500 are spaced apart from each other, the embodiment of the inventive concept is not limited thereto. In other exemplary embodiments, the upper clad layers 500 may be connected to each other.

The tunable laser device 12 according to the inventive may adjust a wavelength of the laser through the method in which the QCSE is generated by using a voltage. The method for tuning the laser using the voltage may have low power consumption characteristics and high tuning rate characteristics. As a result, the tunable laser device 12 may be improved in power characteristic and tuning rate characteristic.

Figure 9:
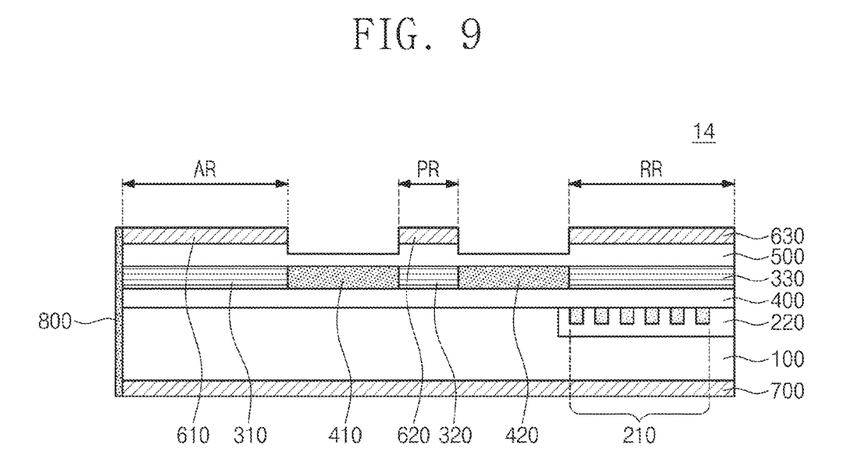
FIG. 9 is a cross-sectional view of a tunable laser device according to exemplary embodiments of the inventive concept.

FIG. 9 is a cross-sectional view of a tunable laser device according to exemplary embodiments of the inventive concept. For briefness of descriptions, substantially the same description as those described with reference to FIG. 1 will be omitted.

Referring to FIG. 9, a tunable laser device 14 including a lower clad layer 100, grating patterns 210, a dielectric part 230, a spacer layer 220, a first quantum well pattern 310, a second quantum well pattern 320, a third quantum well pattern 330, a first passive optical waveguide pattern 410, a second passive optical waveguide pattern 420, an upper clad layer 500, a first upper electrode 610, a second upper electrode 620, a third upper electrode 630, a lower electrode 700, and a reflection layer 800 may be provided. The tunable laser device 14 may include an active region AR, a phase adjustment area PR, and a reflection region RR.

Unlike the structure of FIG. 1, the dielectric part 230 may cover side surfaces and bottom surfaces of the grating patterns 210. The grating patterns 210 may have top surfaces coming into contact with a bottom surface of the spacer layer 220. The dielectric part 230 may include a dielectric material (for example, $SiO_2$, SiN, SiON, or a polymer) or an airgap.

The dielectric part 230 according to the inventive concept may improve optical confinement and optical coupling efficiency between the grating patterns 210. Thus, the tunable laser device 14 may be improved in optical gain characteristic.

Figure 10:
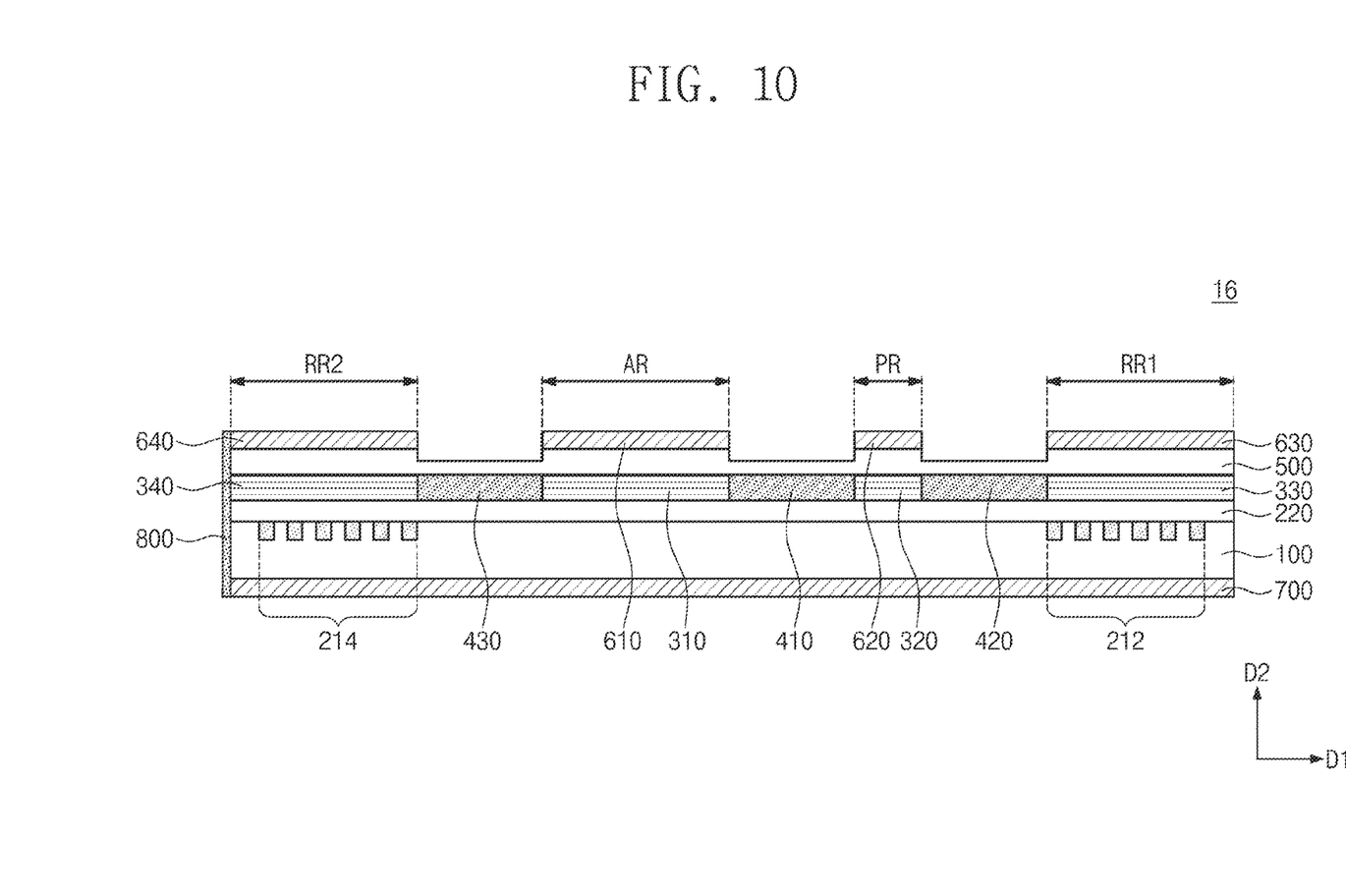
FIG. 10 is a cross-sectional view of a tunable laser device according to exemplary embodiments of the inventive concept.

FIG. 10 is a cross-sectional view of a tunable laser device according to exemplary embodiments of the inventive concept. For briefness of descriptions, substantially the same description as those described with reference to FIG. 1 will be omitted.

Referring to FIG. 10, a tunable laser device 16 including an active region AR, a phase adjustment region PR, a first reflection region RR1, and a second reflection region RR2 may be provided. The active region AR, the phase adjustment region PR, and the first reflection region RR1 may be substantially the same as the active region AR, the phase adjustment region PR, the reflection region RR, which are described with reference to FIG. 1. Unlike the structure of FIG. 1, the reflection layer 800 may not be provided, and the lower clad layer 100, the spacer layer 220, the upper clad layer 500, and the lower electrode 700 may further extend in the first direction D1 to cross the second reflection region RR2. The first reflection region RR1 may include first grating patterns 212. The first grating patterns 212 may be substantially the same as the grating patterns 210 described with reference to FIG. 1.

Unlike the structure of the FIG. 1, second grating patterns 214, a fourth quantum well pattern 340, and a fourth upper electrode 640 may be disposed in the second reflection region RR2. The second grating patterns 214 may be disposed in an upper portion of the lower clad layer 100. The second grating patterns 214 may have top surfaces coming into direct contact with a bottom surface of the spacer layer 220. The second grating patterns 214 may have substantially the same arrangement period as the first grating patterns 212. Each of the second grating patterns 214 may have substantially the same width as each of the first grating patterns 212. In exemplary embodiments, each of the first and second grating patterns 212 and 214 may include a distributed bragg reflector (DBR) or a sampled grating DBR (SG-DBR).

The fourth quantum well pattern 340 may be disposed between the spacer layer 220 and the upper clad layer 500. The fourth quantum well pattern 340 may have substantially the same thickness as each of the first to third quantum well patterns 310, 320, and 330. For example, the fourth quantum well pattern 340 may have a thickness of about 10 nm to about 2,000 nm. Also, the fourth quantum well pattern 340 may have a multilayer structure. For example, the fourth quantum well pattern 340 may have a structure in which two layers different from each other are alternately repeatedly laminated. The two layers different from each other may include different two materials selected from InP, GaAs, AlAs, InAs, AlGaAs, AlInAs, InGaAs, InGaAs, InAlAs, InGaAsP, InAlGaAs, GaN, and InGaN, respectively. The fourth quantum well pattern 340 may be electrically intrinsic.

The fourth upper electrode 640 may be disposed on the upper clad layer 500. The fourth upper electrode 640 may include a conductive material. For example, the fourth upper electrode 640 may include gold (Au), copper (Cu), or aluminum (Al).

Unlike the structure of FIG. 1, light may be reflected by a second reflection region RR2 instead of the reflection layer (see reference numeral 700 of FIG. 1). Light generated from the active region AR may be reciprocated between the first and second reflection regions RR1 and RR2. When a reverse bias is applied to the fourth quantum well pattern 340, light reflected by the second reflection region RR2 may be changed in wavelength. The reverse bias voltage may be applied to the fourth quantum well pattern 340 through the fourth upper electrode 640 and the lower electrode 700.

The tunable laser device 16 according to the inventive may adjust a wavelength of the laser through the method in which the QCSE is generated by using a voltage. The method for tuning the laser using the voltage may have low power consumption characteristics and high tuning rate characteristics. As a result, the tunable laser device 16 may be improved in power characteristic and tuning rate characteristic.

Figure 11:
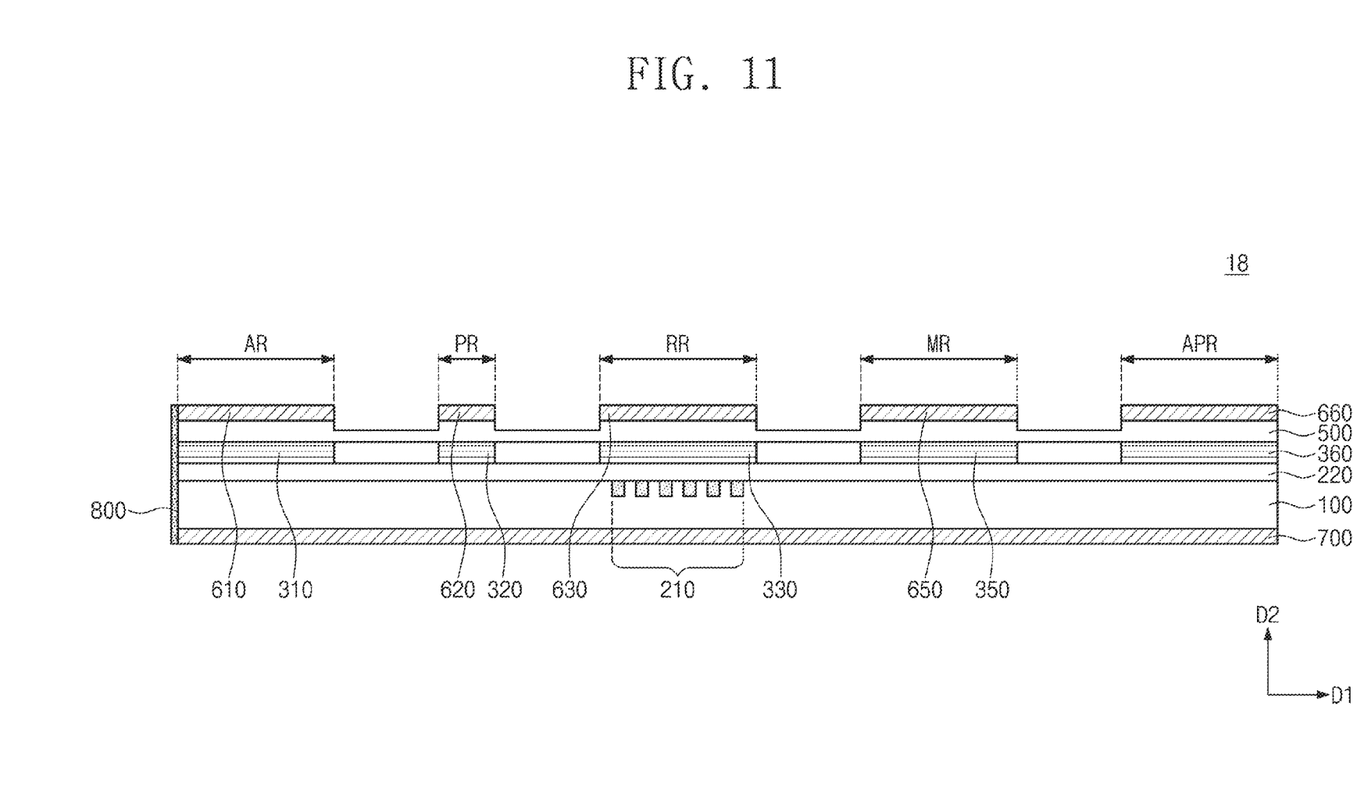
FIG. 11 is a cross-sectional view of a tunable laser device according to exemplary embodiments of the inventive concept.

FIG. 11 is a cross-sectional view of a tunable laser device according to exemplary embodiments of the inventive concept. For briefness of descriptions, substantially the same description as those described with reference to FIG. 1 will be omitted.

Referring to FIG. 11, a tunable laser device 18 including an active region, a phase adjustment region PR, a reflection region RR, a modulation region MR, and an amplification region APR may be provided. The active region AR, the phase adjustment region PR, and the reflection region RR may be substantially the same as the active region AR, the phase adjustment region PR, the reflection region RR, which are described with reference to FIG. 1. Unlike the structure of FIG. 1, the lower clad layer 100, the spacer layer 220, the upper clad layer 500, and the lower electrode 700 may further extend in the first direction D1 to cross the modulation region MR and the amplification region APR.

Unlike the structure of the FIG. 1, a fifth quantum well pattern 350 and a fifth upper electrode 650 may be disposed in the modulation region MR. The fourth quantum well pattern 340 may be disposed between the spacer layer 220 and the upper clad layer 500. The fifth quantum well pattern 350 may have substantially the same thickness as each of the first to third quantum well patterns 310, 320, and 330. For example, the fifth quantum well pattern 350 may have a thickness of about 10 nm to about 2,000 nm. Also, the fifth quantum well pattern 350 may have a multilayer structure. For example, the fifth quantum well pattern 350 may have a structure in which two layers different from each other are alternately repeatedly laminated. The two layers different from each other may include different two materials selected from InP, GaAs, AlAs, InAs, AlGaAs, AlInAs, InGaAs, InGaAs, InAlAs, InGaAsP, InAlGaAs, GaN, and InGaN, respectively. The fifth quantum well pattern 350 may be electrically intrinsic.

The fifth upper electrode 650 may be disposed on the upper clad layer 500. Except for positions of the fifth quantum well pattern 350 and the fifth upper electrode 650, in exemplary embodiments, the modulation region MR may include an electro absorption modulator (EAM) or a mach zehnder modulator (MZM). When a reverse bias is applied to the fifth quantum well pattern 350, light passing through the modulation region MR may be modulated in phase.

A sixth quantum well pattern 360 and a sixth upper electrode 660 may be disposed in the amplification region APR. The sixth quantum well pattern 360 may be disposed between the spacer layer 220 and the upper clad layer 500. The sixth quantum well pattern 360 may have substantially the same thickness as each of the first to third quantum well patterns 310, 320, and 330. For example, the sixth quantum well pattern 360 may have a thickness of about 10 nm to about 2,000 nm. Also, the sixth quantum well pattern 360 may have a multilayer structure. For example, the sixth quantum well pattern 360 may have a structure in which two layers different from each other are alternately repeatedly laminated. The two layers different from each other may include different two materials selected from InP, GaAs, AlAs, InAs, AlGaAs, AlInAs, InGaAs, InGaAs, InAlAs, InGaAsP, InAlGaAs, GaN, and InGaN, respectively. The sixth quantum well pattern 360 may be electrically intrinsic.

The sixth upper electrode 660 may be disposed on the upper clad layer 500. In exemplary embodiments, the amplification region APR may include a semiconductor optical amplifier (SOA). When current is injected into the sixth quantum well pattern 360, light passing through the amplification region APR may be amplified in intensity.

A fourth passive optical waveguide pattern 440 may be disposed between the third and fifth quantum well patterns 330 and 350 to optically connect the third and fifth quantum well patterns 330 and 350 to each other. A fifth passive optical waveguide pattern 450 may be disposed between the fifth and sixth quantum well patterns 350 and 360 to optically connect the fifth and sixth quantum well patterns 350 and 360 to each other.

The tunable laser device 18 according to the inventive may adjust a wavelength of the laser through the method in which the QCSE is generated by using a voltage. The method for tuning the laser using the voltage may have low power consumption characteristics and high tuning rate characteristics. As a result, the tunable laser device 18 may be improved in power characteristic and tuning rate characteristic.

Figure 12:
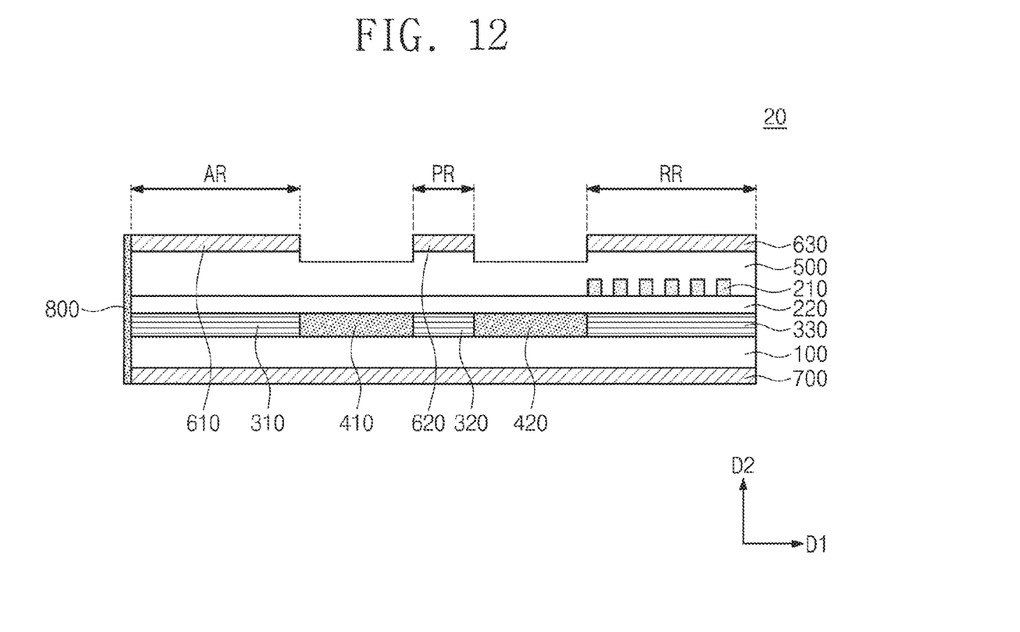
FIG. 12 is a cross-sectional view of a tunable laser device according to exemplary embodiments of the inventive concept.

FIG. 12 is a cross-sectional view of a tunable laser device according to exemplary embodiments of the inventive concept. For briefness of descriptions, substantially the same description as those described with reference to FIG. 1 will be omitted.

Referring to FIG. 12, a tunable laser device 20 may include a lower clad layer 100, grating patterns 210, a spacer layer 220, a first quantum well pattern 310, a second quantum well pattern 320, a third quantum well pattern 330, a first passive optical waveguide pattern 410, a second passive optical waveguide pattern 420, an upper clad layer 500, a first upper electrode 610, a second upper electrode 620, a third upper electrode 630, a lower electrode 700, and a reflection layer 800.

Unlike the structure of FIG. 1, the grating patterns 210 may be surrounded by the upper clad layer 500. The grating patterns 210 may be substantially the same as the grating patterns 210 of FIG. 1 except for their positions.

The spacer layer 220 may be disposed between the upper clad layer 500 and the first to third quantum well patterns 310, 320, and 330. The spacer layer 220 may be substantially the same as the spacer layer 220 of FIG. 1 except for its position.

According to the inventive concept, the tunable laser device 20 may be improved in power characteristic and tuning rate characteristic.

Figure 13:
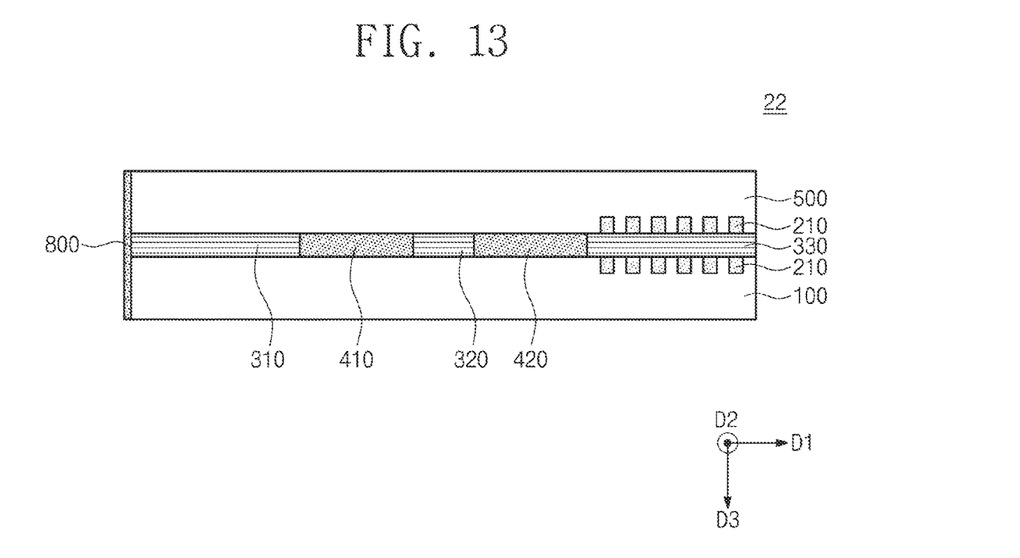
FIG. 13 is a plan view of a tunable laser device according to exemplary embodiments of the inventive concept.
Figure 14:
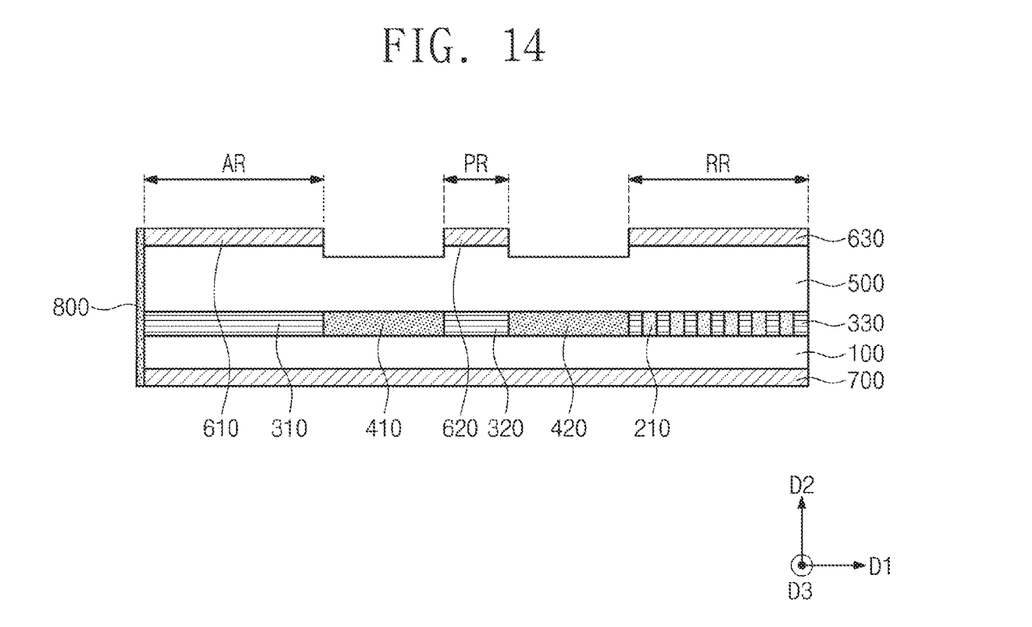
FIG. 14 is a side view of the tunable laser device according to exemplary embodiments of the inventive concept.

FIG. 13 is a plan view of a tunable laser device according to exemplary embodiments of the inventive concept. FIG. 14 is a side view of the tunable laser device according to exemplary embodiments of the inventive concept. For briefness of descriptions, substantially the same description as those described with reference to FIG. 1 will be omitted.

Referring to FIGS. 13 and 14, a tunable laser device 22 may include a lower clad layer 100, grating patterns 210, a first quantum well pattern 310, a second quantum well pattern 320, a third quantum well pattern 330, a first passive optical waveguide pattern 410, a second passive optical waveguide pattern 420, an upper clad layer 500, a first upper electrode 610, a second upper electrode 620, a third upper electrode 630, a lower electrode 700, and a reflection layer 800.

Unlike the structure of FIG. 1, the grating patterns 210 may be disposed on both side surfaces of the third quantum well pattern 330. The grating patterns 210 may be substantially the same as the grating patterns 210 of FIG. 1 except for their positions. In other exemplary embodiments, the grating patterns 210 may be disposed on only one side surface of the third quantum well pattern 330.

Unlike the structure of FIG. 1, the spacer layer 220 may not be provided.

According to the inventive concept, the tunable laser device 22 may be improved in power characteristic and tuning rate characteristic.

According to the inventive concept, the tunable laser device that is improved in power characteristic and modulation rate characteristic may be provided.

According to the inventive concept, the method for manufacturing the tunable laser device that is not degraded in characteristic of the tunable laser device.

However, the effects of the inventive concept are not limited to the above-described descriptions.

The above-described descriptions according to the embodiments of the inventive concept are exemplarily provided for explaining the inventive concept. Thus, it is understood that the present invention should not be limited to these exemplary embodiments but various changes and modifications can be made by one ordinary skilled in the art within the spirit and scope of the present invention as hereinafter claimed.

What is claimed is:

1. A tunable laser device comprising:
   a lower clad layer;
   first to third quantum well patterns disposed on the lower clad layer and arranged in a first direction parallel to a top surface of the lower clad layer;
   an upper clad layer disposed on the first quantum well pattern; and
   first grating patterns disposed between the third quantum well pattern and the lower clad layer,
   wherein the first to third quantum well patterns are arranged in the first direction parallel to the top surface of the lower clad layer,
   the upper clad layer comprises a p-type conductive clad layer,
   the lower clad layer comprises an n-type conductive clad layer,
   the third quantum well pattern is electrically intrinsic, and
   when a reverse bias is applied to the upper clad layer, the third quantum well pattern, and the lower clad layer, the third quantum well pattern is changed in refractive index.

2. The tunable laser device of claim 1, further comprising:
   a first passive optical waveguide pattern disposed between the first and second quantum well patterns and optically coupled to the first and second quantum well patterns; and
   a second passive optical waveguide pattern disposed between the second and third quantum well patterns and optically coupled to the second and third quantum well patterns,
   wherein each of the first passive optical waveguide pattern and the second passive optical waveguide pattern has a refractive index different from that of the lower clad layer.

3. The tunable laser device of claim 1, further comprising an airgap provided between the first grating patterns and the lower clad layer,
   wherein the first grating patterns are exposed by the airgap.

4. The tunable laser device of claim 1, further comprising an insulation layer disposed between the first quantum well pattern and the lower clad layer,
   wherein the first grating patterns are disposed within the insulation layer.

5. The tunable laser device of claim 1, further comprising a reflection layer disposed on a side surface of the third quantum well pattern to extend along the side surface of the third quantum well pattern.

6. The tunable laser device of claim 1, further comprising:
   a fourth quantum well pattern spaced apart from the third quantum well pattern in the first direction;
   a third passive optical waveguide pattern disposed between the third and fourth quantum well patterns and optically coupled to the third and fourth quantum well patterns; and
   second grating patterns disposed between the fourth quantum well pattern and the lower clad layer,
   wherein the fourth quantum well pattern is electrically intrinsic, and
   when the reverse bias is applied to the upper clad layer, the fourth quantum well pattern, and the lower clad layer, the fourth quantum well pattern is changed in refractive index.

7. The tunable laser device of claim 6, wherein each of the first and second grating patterns comprises a distributed bragg reflector (DBR) or a sampled-grating DBR.

8. The tunable laser device of claim 1, further comprising a spacer disposed between the first to third quantum well patterns and the first grating patterns,
   wherein the spacer comprises substantially the same material as the lower clad layer.

9. The tunable laser device of claim 1, further comprising:
   a fifth quantum well pattern disposed at an opposite side of the second quantum well pattern with the third quantum well pattern between the second and fifth quantum well patterns; and
   a sixth quantum well pattern disposed at an opposite side of the third quantum well pattern with the fifth quantum well pattern between the third and sixth quantum well patterns,
   wherein the fifth and sixth quantum well patterns are disposed on the lower clad layer.

10. The tunable laser device of claim 1, further comprising a passive optical waveguide layer disposed between the first to third quantum well patterns and the first grating patterns to extend in the first direction.

11. A method for manufacturing a tunable laser device, the method comprising:
    preparing a lower clad layer;
    forming a first quantum well pattern, a second quantum well pattern, and a third quantum well pattern on the lower clad layer laterally;
    forming a first passive optical waveguide pattern between the first and second quantum well patterns and a second passive optical waveguide pattern between the second and third quantum well patterns; and
    forming an upper clad layer on the first to third quantum well patterns,
    wherein the first quantum well pattern, the first passive optical waveguide pattern, the second quantum well pattern, the second passive optical waveguide pattern, and the third quantum well pattern are arranged in a first direction parallel to a top surface of the lower clad layer.

12. The method of claim 11, further comprising:
    forming grating patterns on the lower clad layer before the forming of the first to third quantum well patterns; and
    forming a spacer layer on the lower clad layer to cover the grating patterns,
    wherein the spacer layer extends in the first direction.

13. The method of claim 12, wherein the forming of the first quantum well pattern comprises:
    forming a first preliminary quantum well layer, which extends in the first direction, on the spacer layer; and
    patterning the first preliminary quantum well layer.

14. The method of claim 13, wherein the forming of the second and third quantum well patterns comprises:
    forming a second preliminary quantum well layer, which extends in the first direction, on the spacer layer; and
    patterning the second preliminary quantum well layer.

15. The method of claim 14, wherein the forming of the first passive optical waveguide pattern and the second passive optical waveguide pattern comprises:
    forming a preliminary optical waveguide layer on the first to third quantum well patterns and the spacer layer; and
    removing the preliminary optical waveguide layer formed on the first to third quantum well patterns to expose top surfaces of the third to third quantum well patterns.

* * * * *